(12) United States Patent
Thompson et al.

(10) Patent No.: US 6,252,289 B1
(45) Date of Patent: Jun. 26, 2001

(54) ELECTRICAL CONTACT AND HOUSING FOR USE AS AN INTERFACE BETWEEN A TESTING FIXTURE AND A DEVICE UNDER TEST

(75) Inventors: Stephen Michael Thompson, Wyomissing Hills; Gerard J. Mietelski, Mohnton; William E. Fulmer, Sinking Spring, all of PA (US)

(73) Assignee: Agere Systems Guardian Corporation, Allentown, PA (US)

( * ) Notice: Subject to any disclaimer, the term of this patent is extended or adjusted under 35 U.S.C. 154(b) by 0 days.

(21) Appl. No.: 09/480,014

(22) Filed: Jan. 10, 2000

(51) Int. Cl.$^7$ .............................. G01R 31/02; G01R 31/26
(52) U.S. Cl. ................... 257/490; 257/797; 257/704; 257/709; 257/710; 257/725; 324/745; 324/757; 324/758; 279/126; 439/73; 439/72
(58) Field of Search ........................ 257/678, 797, 257/704, 709, 710, 718, 719, 725–732, 690, 773, 785; 324/765, 757, 758, 760, 158.1, 755; 279/126; 439/73, 72

(56) References Cited

U.S. PATENT DOCUMENTS

| | | | |
|---|---|---|---|
| 5,349,787 | * 9/1994 | Wood | 269/900 |
| 5,528,159 | * 6/1996 | Charlton et al. | 324/758 |
| 5,557,212 | * 9/1996 | Isaac et al. | 324/755 |
| 5,949,238 | * 9/1999 | Marquis | 324/754 |
| 6,043,667 | * 3/2000 | Cadwallader et al. | 324/758 |
| 6,046,060 | * 4/2000 | Budnaitis | 438/10 |
| 6,057,700 | * 5/2000 | Crispell | 324/765 |
| 6,064,214 | * 5/2000 | Self | 324/754 |
| 6,069,483 | * 5/2000 | Maxwell et al. | 324/760 |
| 6,078,185 | * 6/2000 | Tanaka et al. | 324/755 |

* cited by examiner

Primary Examiner—Alexander O. Williams
(74) Attorney, Agent, or Firm—Darby & Darby

(57) ABSTRACT

An electrical contact, preferably made from a gold-plated, beryllium-copper flat stock which allows radio-frequency signal to pass with low noise, is provided within a housing. The electrical contact has two arms for contact with two external circuits. The electrical contact further has a pivot for allowing the electrical contact to adjust within the housing. The housing supports the electrical contact and is provided with a pivot point, such as a non-conducting rubber tip, for meeting the pivot of the electrical contact. The housing combined with one or more of the electrical contacts results in a testing port especially suited for providing high frequency communication between an electrical testing fixture and a device under test, such as a high-frequency hybrid integrated circuit.

23 Claims, 3 Drawing Sheets

ELECTRICAL CONTACT AND HOUSING FOR USE AS AN INTERFACE BETWEEN A TESTING FIXTURE AND A DEVICE UNDER TEST

BACKGROUND OF THE INVENTION

1. Field of the Invention

The present invention relates to electrical connectors, and relates more specifically to electrical connectors within a distinct housing spaced from a panel circuit arrangement.

2. Description of Related Art

During the manufacturing of hybrid integrated-circuit (HIC) packages and prior to shipment of the same, it is desirable to test each package, or a random sample of the manufactured packages, to insure that they respond properly to test inputs. The testing is generally accomplished by placing an HIC package in communication with a testing fixture which applies certain inputs to one or more ports of the HIC package. The response to these inputs is measured and evaluated by the testing system. If the tested package responds to the inputs within a predetermined level of accuracy, it (or the batch of HIC packages it represents) is then shipped to customers from the manufacturing facility.

A particular problem arises with testing HIC packages that operate at high speeds. At speeds of 2.5 GHz and above, for example, prior art electrical connections between the testing fixture and the HIC package under test cause parasitic inductances and capacitances which could interfere with test results.

One prior art attempt at solving this problem involves using lead lines made of gold on the testing fixture, and forming the structure of the testing fixture from a material with a high dielectric characteristic, such as polyethyleneterephthalate (PTFE). This reduces the occurrence of parasitic inductances and capacitances. However, the preferred method of connecting the gold lead lines to the HIC package under test is to weld or solder the gold lead lines to the testing ports of the package. This process takes much time, making it inefficient in the testing of mass-manufactured HIC packages.

Another attempt, which specifically addresses the inefficiencies of soldering and welding test leads, is described in commonly-owned co-pending U.S. patent application Ser. No. 09/073,279 entitled "PRESSURE CONTROLLED ALIGNMENT FIXTURE" filed in the name of Crispell et al. and incorporated herein by reference. Crispell et al. describe a testing fixture utilizing a high dielectric substrate with gold test leads and a layer of vertically conductive material disposed between the substrate and a base of the fixture. Upon application of downward pressure, the vertically conductive material provides a conduction path between the testing fixture and the testing device.

However Crispell et al., as well as other prior art attempts to provide electrical contacts which operate at high frequencies, employ spring-controlled socket testing fixtures. The spring contacts of the testing fixture have the following disadvantages: (1) There is a degree of non-uniformity in the shaping process of the spring contacts used by the testing fixture, which results in planar irregularities in the height of the contacts. (2) The use of Be—Cu round wire in the base of the testing fixture limits the number of times the fixture may be repeatedly used without failure and further results in imprecise contact alignment with the device under test. (3) There is a tendency for the spring contact to damage both the testing fixture and the device under test due to its sharp edges.

Thus, there is a need for an electrical interface which may be readily inserted between a testing fixture and a device under test, such as an HIC package, during testing. There is a further need for an electrical interface which demonstrates reduced parasitic capacitances and inductances at high frequencies. There is also a need for an electrical interface which does not significantly damage the contact pads of, for example, a device under test. There is a further need for an electrical interface which may be repeatedly used to test mass-manufactured HIC packages without significant wear-and-tear.

SUMMARY OF THE INVENTION

In order to address certain shortcomings of the prior art, an electrical contact of the instant invention comprises a first arm for providing a first conductive contact and a second arm disposed at a predetermined distance from the first arm. The second arm provides a second conductive contact. There is a support member disposed between the first and second arms. The support member has a first end from which at least one of the first and second arms extend and a portion disposed between the first and second arms along the first end for supporting the electrical contact apparatus within a housing. The second end has at least one pivot for allowing the support member to adjust within the housing when at least one of the first and second conductive contacts are in communication with an external circuit.

In accordance with the instant invention, a housing is provided for an electrical contact having a first arm and a second arm. The housing includes a disc for receiving a pivot of an electrical contact apparatus and an interior rim for supporting the electrical contact apparatus. The disc and the interior rim cooperate to allow the electrical contact apparatus to adjust when at least one of a first arm and a second arm of the electrical contact is in communication with an external circuit.

According to the instant invention, a testing port of one embodiment of the instant invention comprises an electrical contact apparatus which has a first arm for providing a first conductive contact and a second arm disposed at a predetermined distance from the first arm. The second arm provides a second conductive contact. The electrical contact apparatus further has a support member including the first and second arms, the support member including a first end from which at least one of the first and second arms extend and a portion disposed between the first and second arms along the first end for supporting the electrical contact apparatus within a housing. The support member further has a second end comprising a pivot for allowing the electrical contact apparatus to adjust within the housing. The testing port further has a housing which includes a disc for receiving the pivot and an interior rim for supporting the electrical contact apparatus at the portion. Accordingly, the pivot, the disc and the interior rim cooperate to allow the electrical contact apparatus to adjust when at least one of the first conductive contact and the second conductive contact are in communication with an external circuit.

According to the instant invention a method for providing an electrical contact for a test circuit includes the following steps. An electrical contact is supported within a housing substantially between a first arm and a second arm of the electrical contact. A pivot is provided on an end of the electrical contact substantially opposite one of the first arm and the second arm. A disc is provided within the housing for operative contact with the pivot.

It is a first advantage of an embodiment of the instant invention that an electrical contact with a pivot may adjust within a testing port housing so as to compensate for slight differences in the planarity of the contacts of a testing fixture and a device under test. It is a second advantage of an embodiment the instant invention that the pivoting action further decreases the potential to harm the contacts of the testing fixture and the device under test. It is a third advantage of an embodiment of the instant invention that the electrical contact is made of a gold-plated beryllium-copper flat stock which provides a durable, electrically conductive material which demonstrates low parasitic capacitances and inductances at high frequencies. It is a fourth advantage of an embodiment of the present invention that the housing may be rapidly connected and disconnected from between the testing fixture and the device under test so that multiple, repeated tests on a plurality of mass-produced HIC packages may be made in a rapid manner.

BRIEF DESCRIPTION OF THE DRAWINGS

Further objects and advantages of the present invention will become apparent to one of ordinary skill in the art upon review of the following detailed description of preferred embodiments when taken in conjunction with the accompanying drawings, of which.

DETAILED DESCRIPTION OF PREFERRED EMBODIMENTS

Figure 1:
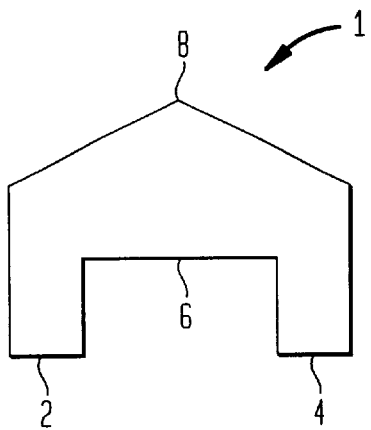
FIG. 1 is an illustration of an electrical contact of the instant invention.

Referring now to FIGS. 1–6, wherein similar or identical elements are numbered in like manner, FIG. 1 depicts an electrical contact 1 for use with the present invention. The electrical contact 1 has a first arm 2 for providing a first electrically-conductive contact and has a second arm 4 for providing a second electrically-conductive contact. The electrical contact 1 preferably has a portion 6 disposed between the first arm 2 and the second arm 4 so that the electrical contact 1 may be supported within a housing 9, as depicted in FIG. 2A and FIG. 2B. A pivot 8 is provided so that the electrical contact 1 may adjust within housing 9 when the first arm 2 and the second arm 4 are in communication with an external circuit. The electrical contact 1 is preferably made from gold-plated 30 beryllium-copper flat stock, but may be made from any suitable material which demonstrates insignificant capacitances and inductances at high-frequency signal ranges.

Figure 2A:
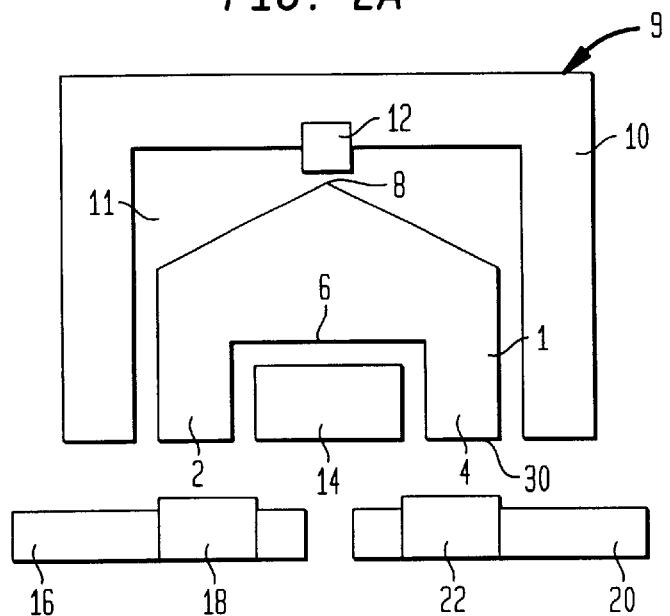
FIG. 2A is a cross-section of a testing port of the instant invention with a housing and electrical contact.
Figure 2B:
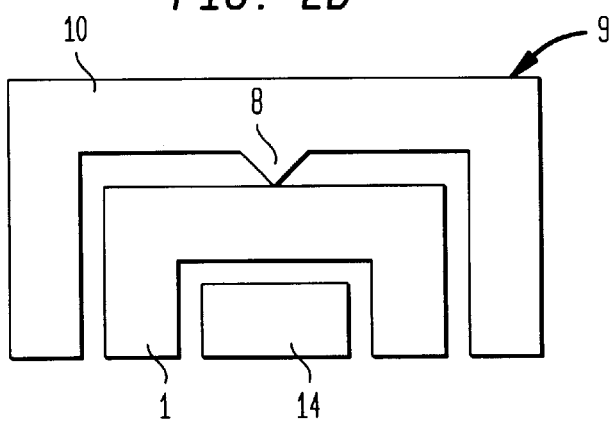
FIG. 2B is a cross-section of an alternate embodiment of the testing port of FIG. 2A.

Turning now to FIG. 2A, a cross section view of a housing 9 is presented. The electrical contact 1 is supported within the housing 9 by an outer casing 10 in conjunction with an inner rim 14 which is disposed at the portion 6 between the first arm 2 and the second arm 4. The outer casing 10 and the inner rim 14 are both preferably made of non-conducting materials. The outer casing 10 further encloses a disc 12, preferably made from rubber, plastic or another insulating material, which mates with the pivot 8 and does not allow electrical conductivity between the electrical contact 1 and the housing 9. The disc 12 allows the electrical contact 1 to adjust or pivot when at least one of the first arm 2 and the second arm 4 are in communication with an external circuit.

It is contemplated that in an alternate embodiment (displayed in FIG. 2B) the electrical contact 1 may not be provided with a pivot 8, in which case the back side of the electrical contact 1 may be flat and a portion of the housing may act as the pivot 8. Accordingly, the flat end may further be mated with the disc 12 which has a pivot point about which the electrical contact 1 may adjust when at least one of the first arm 2 and the second arm 4 are in communication with an external circuit.

Figure 3:
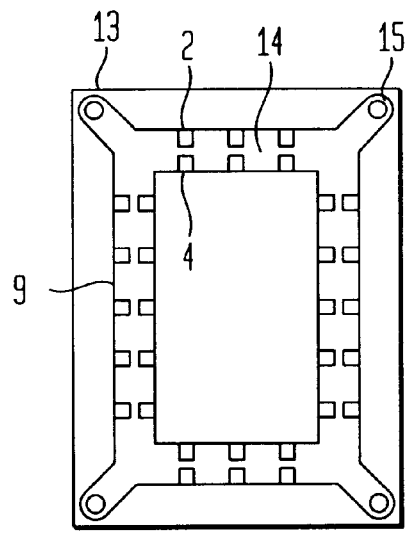
FIG. 3 is an illustration of a bottom view of the testing port of the instant invention.

The first arm 2 and the second arm 4 are exposed from the bottom end of housing 9, as further depicted in FIGS. 2 and 3, such that the first arm 2 may be in communication with a first contact 18 of a testing fixture 16 and the second arm 4 may be in communication with second contact 22 of a device under test 20, such as a HIC package. The heights of the first contact 18 and the second contact 22 may not be precisely uniform, thereby creating a difference in the planarity of the two contacts 18, 22. Thus, when the first arm 2 and the second arm 4 are placed in communication with the first contact 18 and the second contact 22, respectively, the electrical contact 1 may adjust or pivot around the pivot 8 in conjunction with the disc 12. A chamber 11 of the housing 9 may have adequate space to allow the electrical contact 1 to adjust in this manner.

FIG. 3 depicts a bottom end of a testing port 13 which includes the housing 9. The first arm 2 and second arm 4 of a plurality of electrical contacts 1 are exposed from the bottom end of the housing 9. Electrical contact 1 is supported by the inner rim 14 of the housing 9. The number of electrical contacts 1 will depend on the number of connections to be made between testing device 16 and the device under test 20. The testing port 13 may further have a plurality of nonconductive connectors 15 which allow the testing port to be secured to the testing fixture 16 in any manner contemplated by one of ordinary skill in the art.

Figure 4:
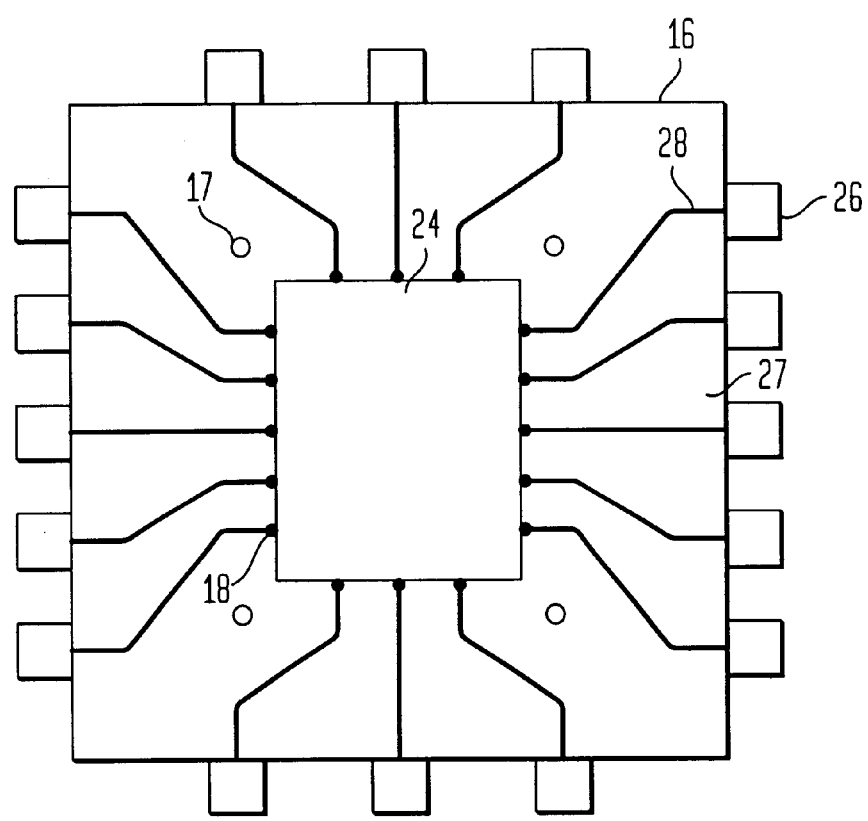
FIG. 4 is an illustration of a testing fixture for use in conjunction with a testing port of the instant invention.

FIG. 4 depicts a testing fixture 16 which may have a plurality of input/output ports 26 connected to a substrate 27 made of, for example, PTFE. The testing ports 26 are each connected to a first contact 18 by a conduction path 28 which may each be etched and inlaid into the substrate 27. The testing fixture 16 has a socket 24 for receiving a device under test 20, such as a HIC package. The testing fixture 16 further has a plurality of holes 17 for receiving non-conductive connectors 15 of a testing port 13.

Figure 5:
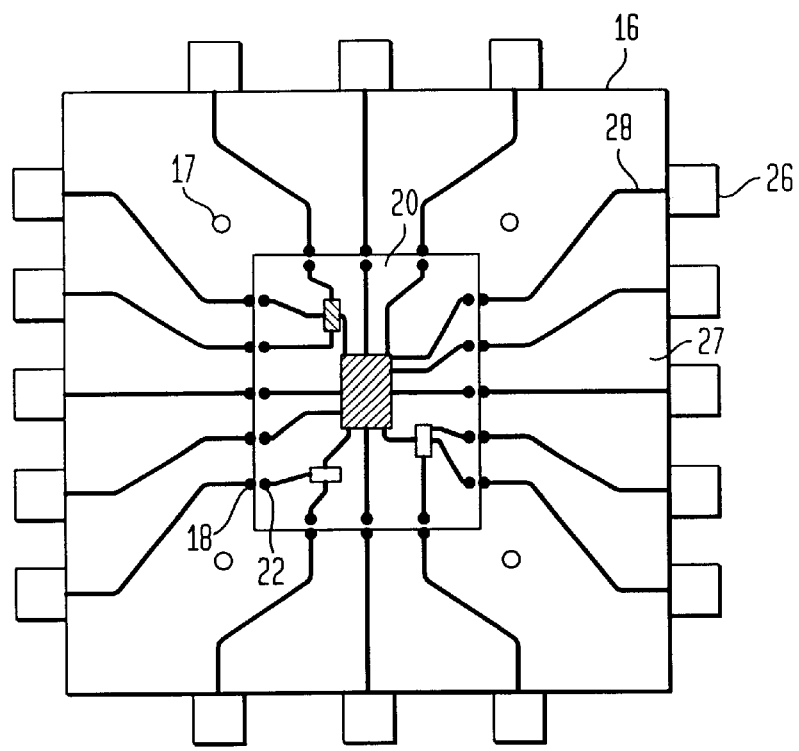
FIG. 5 is an illustration of a testing fixture with a HIC package for testing in accordance with the instant invention.

FIG. 5 depicts an exemplary testing fixture 16 as displayed in the previous FIG. 4. A device under test 20, such as a HIC package, has been placed in socket 24 for testing. Each second contact 22 may be substantially aligned with a first contact 18, so that they may be placed in operative electrical communication with each other via an electrical connector 1.

Figure 6:
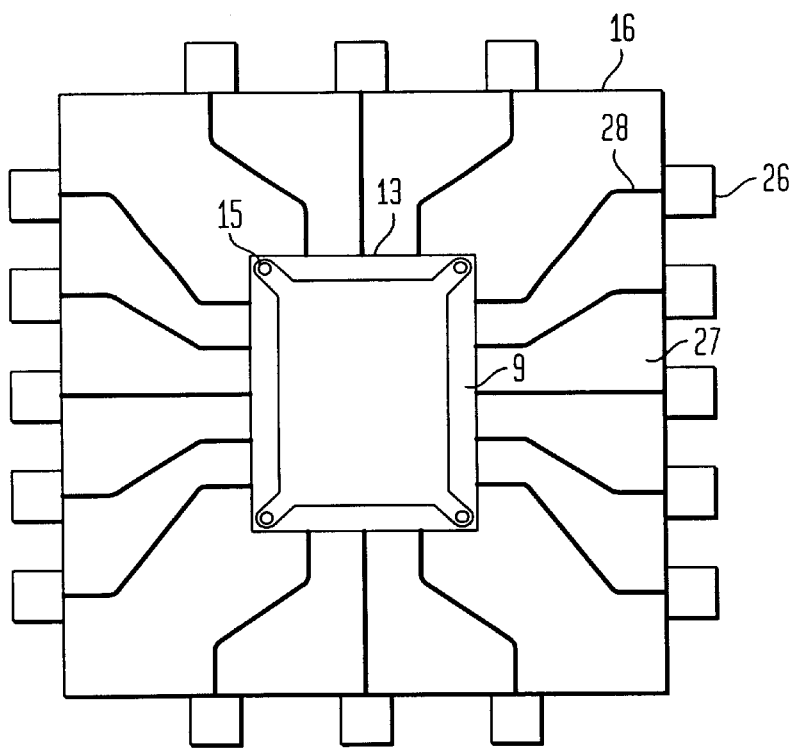
FIG. 6 is an illustration of a testing port of the instant invention operatively connected between the testing fixture and the HIC package to be tested.

FIG. 6 displays the arrangement of FIG. 5 wherein the testing port 13 has been added so that testing fixture 16 and device under test 20 are in operative communication via the electrical contacts 1 of the testing port 13. The non-conductive connectors 15 may each be optionally mated with the plurality of holes 17 to secure the testing port 13 to the testing fixture 16, in any manner contemplated by one of ordinary skill in the art. Each electrical contact 1 of testing port 13 is arranged so that a first arm 2 is in communication with a first contact 18, and a second arm 4 is in communication with a second contact 22. Each electrical contact 1 is further adjustable upon the making of each connection through a pivot 8 in conjunction with a disc 12 disposed within the housing 9. The adjustment may result solely from the difference in the planarity of the first contact 18 and the second contact 22. The electrical contacts 1 are operative so that a direct current (DC), a radio frequency (RF) signal, or the like may be communicated between the testing device 16 and the device under test 20 through the contacts 18, 22. Further uses of electrical contact 1, housing 9 and testing port 13, not specifically disclosed herein, may be apparent to one of ordinary skill in the art.

Although the invention has been described in detail in the foregoing embodiments, it is to be understood that these examples have been provided for purposes of illustration only and that other variations both in form and detail can be made thereupon by those skilled in the art without departing from the spirit and scope of the invention, which is defined solely by the appended claims.

We claim:

1. An electrical contact apparatus, comprising:
    a first arm for providing a first conductive contact;
    a second arm for providing a second conductive contact, the second arm being disposed at a predetermined distance from the first arm; and
    a support member including the first and second arms, the support member having:
        a first end from which at least one of the first and second arms extend;
        a portion disposed between the first and second arms along the first end for supporting the electrical contact apparatus within a housing; and
        a second end comprising at least one pivot for allowing the support member to adjust within the housing when at least one of the first and second conductive contacts are in communication with an external circuit,
    wherein at least one of the first arm, the second arm and the support member are made from a gold-plated beryllium-copper compound.

2. The apparatus of claim 1, wherein the second end is flat.

3. The apparatus of claim 1, wherein the apparatus is placed between a testing fixture and a device under test.

4. The apparatus of claim 3, wherein the first arm provides the first conductive contact with the testing fixture.

5. The apparatus of claim 3, wherein the second arm provides the second conductive contact with the device under test.

6. The apparatus of claim 1, wherein the apparatus is operable to transmit a radio frequency signal.

7. The apparatus of claim 1, wherein the first end is substantially opposite the second end.

8. A housing for an electrical contact apparatus having a first arm and a second arm, the housing comprising:
    a disc comprising a flexible insulating material for receiving a pivot of the electrical contact apparatus; and
    an interior rim for supporting the electrical contact apparatus, wherein the disc and the interior rim cooperate to allow the electrical contact apparatus to adjust when at least one of the first arm and the second arm contacts an external circuit.

9. A housing for an electrical contact apparatus having a first arm and a second arm, the housing comprising:
    a disc comprising rubber for receiving a pivot of the electrical contact apparatus; and
    an interior rim for supporting the electrical contact apparatus, wherein the disc and the interior rim cooperate to allow the electrical contact apparatus to adjust when at least one of the first arm and the second arm contacts an external circuit.

10. A testing port comprising:
a housing; and
at least one electrical contact apparatus including:
    a first arm for providing a first conductive contact;
    a second arm for providing a second conductive contact, the second arm being disposed at a predetermined distance from the first arm; and
    a support member including the first and second arms, the support member also including:
        a first end from which at least one of the first and second arms extend;
        a portion disposed between the first and second arms along the first end for supporting the at least one electrical contact apparatus within the housing; and
        a second end comprising a pivot for allowing the at least one electrical contact apparatus to adjust within the housing;
the housing including:
    a disc comprising a flexible insulating material for receiving the pivot; and
    an interior rim for supporting the at least one electrical contact apparatus, wherein the pivot, the disc and the interior rim cooperate to allow the at least one electrical contact apparatus to adjust when at least one of the first conductive contact and the second conductive contact are in communication with an external circuit.

11. A testing port comprising:
a housing; and
at least one electrical contact apparatus including:
    a first arm for providing a first conductive contact;
    a second arm for providing a second conductive contact, the second arm being disposed at a predetermined distance from the first arm; and
    a support member including the first and second arms, the support member also including:
        a first end from which at least one of the first and second arms extend;
        a portion disposed between the first and second arms along the first end for supporting the at least one electrical contact apparatus within the housing; and
        a second end comprising a pivot for allowing the at least one electrical contact apparatus to adjust within the housing;
the housing including:
    a disc comprising rubber for receiving the pivot; and
    an interior rim for supporting the at least one electrical contact apparatus at the portion, wherein the pivot, the disc and the interior rim cooperate to allow the at least one electrical contact apparatus to adjust when at least one of the first conductive contact and the second conductive contact are in communication with an external circuit.

12. A testing port comprising:
a housing; and
at least one electrical contact apparatus including:
    a first arm for providing a first conductive contact;
    a second arm for providing a second conductive contact, the second arm being disposed at a predetermined distance from the first arm; and a support member including the first and second arms, the support member also including:
- a first end from which at least one of the first and second arms extend;
- a portion disposed between the first and second arms along the first end for supporting the at least one electrical contact apparatus within the housing; and
- a second end comprising a pivot for allowing the at least one electrical contact apparatus to adjust within the housing;

the housing including:
- a disc comprising a pivot point for receiving the pivot; and
- an interior rim for supporting the at least one electrical contact apparatus at the portion, wherein the pivot, the disc and the interior rim cooperate to allow the at least one electrical contact apparatus to adjust when at least one of the first conductive contact and the second conductive contact are in communication with an external circuit.

13. The housing of claim 8, wherein the interior rim supports the electrical contact apparatus at a portion disposed substantially between the first arm and the second arm.

14. The housing of claim 8, wherein the pivot is a flat end of the electrical contact apparatus and the disc comprises a pivot point.

15. The testing port of claim 10, wherein at least one of the first arm, the second arm and the support member are made of a beryllium-copper compound.

16. The testing port of claim 15, wherein at least one of the first arm, the second arm and the support member has a gold-plating.

17. The testing port of claim 10, wherein the at least one electrical contact apparatus is placed between a testing fixture and a device under test.

18. The testing port of claim 17, wherein the first arm provides the first conductive contact with the testing fixture.

19. The testing port of claim 17, wherein the second arm provides the second conductive contact with the device under test.

20. The testing port of claim 10, wherein the at least one electrical contact apparatus is operable to transmit a radio frequency signal.

21. The testing port of claim 10, wherein the first end is substantially opposite the second end.

22. The testing port of claim 10, wherein the interior rim supports the at least one electrical contact apparatus at the portion.

23. The testing port of claim 10, wherein the pivot is a flat end of the at least one electrical contact apparatus.

* * * * *